United States Patent [19]

Collins et al.

[11] 3,924,191

[45] Dec. 2, 1975

[54] TOUCH-TUNING SYSTEM FOR A TELEVISION RECEIVER

[75] Inventors: Johnny Collins, Oak Park; Melvin C. Hendrickson, Elmhurst, both of Ill.

[73] Assignee: Zenith Radio Corporation, Chicago, Ill.

[22] Filed: Apr. 1, 1974

[21] Appl. No.: 457,021

[52] U.S. Cl. .................... 325/464; 325/470; 334/15

[51] Int. Cl.[2] .............................................. H04B 1/16

[58] Field of Search ........... 325/332, 335, 390, 391, 325/393, 420, 422, 464, 465, 468, 469, 470; 340/168 R; 343/205; 331/177 R, 177 V, 179; 318/560, 569, 628; 307/220 R, 221, 222, 307/233 R; 334/15, 18

[56] References Cited

UNITED STATES PATENTS

| | | | |
|---|---|---|---|
| 3,518,586 | 6/1970 | Nilssen et al. | 325/465 X |
| 3,654,557 | 4/1972 | Sakamoto et al. | 334/15 X |
| 3,662,270 | 5/1972 | Evans | 325/390 |
| 3,748,645 | 7/1973 | Kawashima | 325/465 X |
| 3,839,681 | 10/1974 | Mogi | 307/223 R |

*Primary Examiner*—Benedict V. Safourek
*Attorney, Agent, or Firm*—Nicholas A. Camasto

[57] ABSTRACT

A varactor tuner television receiver touch-tuning system includes a clock pulse-driven counter supplying a binary to decimal converter, which is coupled to an analog switch for sequentially transferring control of the tuner among a plurality of tuning positions. A tuning potentiometer, a position indicator and a position switch are located at each tuning position. Upon closure of any position switch, a transistor switch is enabled to start the counter. The transistor switch is disabled to stop the counter when the selected tuning position is reached.

7 Claims, 1 Drawing Figure

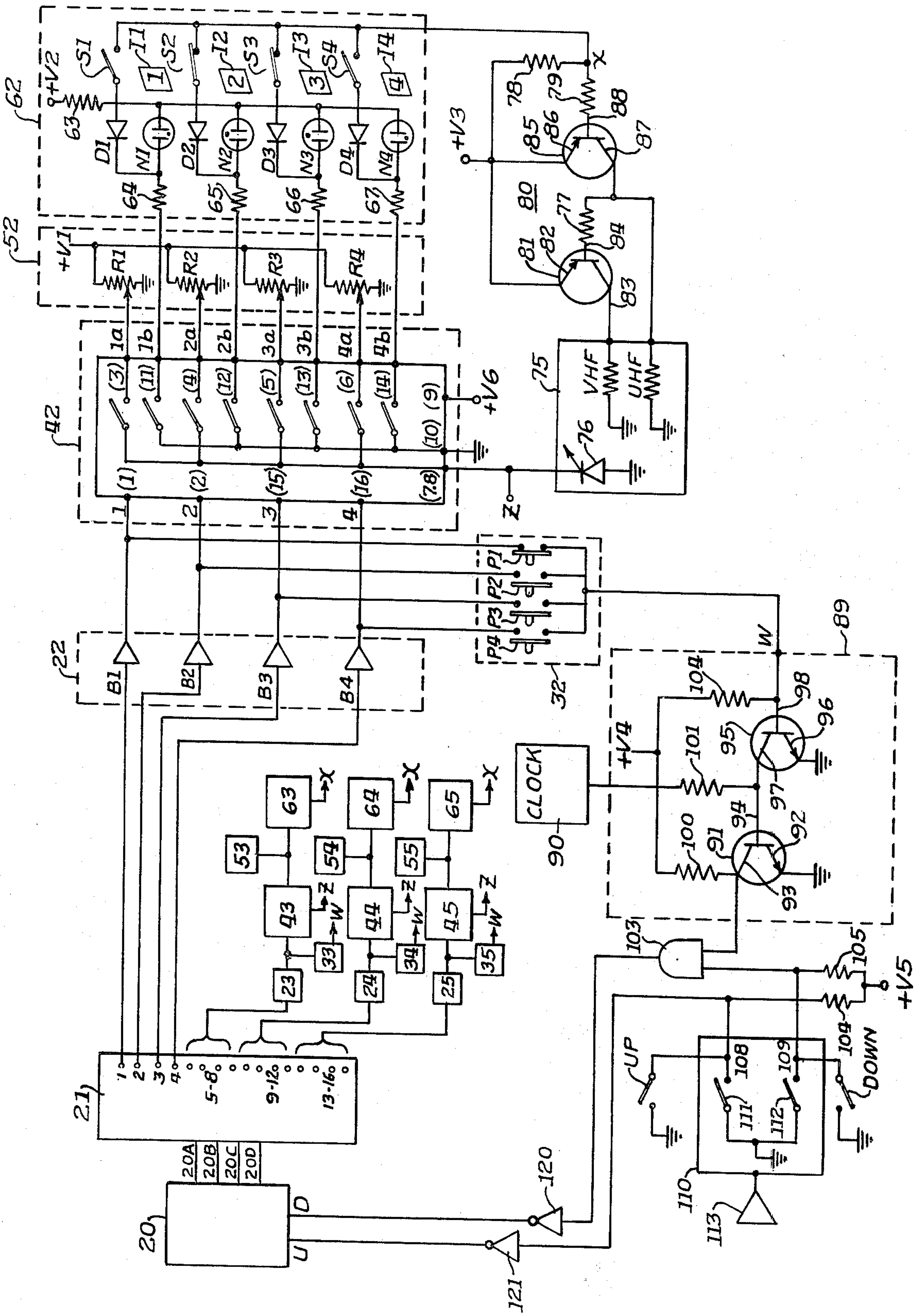
CLOCK
VHF
UHF
UP
DOWN
+V1
+V2
+V3
+V4
+V5
+V6

TOUCH-TUNING SYSTEM FOR A TELEVISION RECEIVER

BACKGROUND OF THE INVENTION

In the television art, silent, simple, fast-acting tuning systems requiring minimal operator effort and skill are in demand. Varactor diode tuners, being fast and silent, have paved the way for so-called touch-tuning systems, which are characterized in that the viewer need only gently touch a button to change channels.

Electro-mechanical arrangements incorporating motor driven switches have been extensively used for channel changing in television tuners. In general each actuation of a tuning button advanced the mechanical tuner or switch (in the case of a varactor tuner) to the next adjacent preset tuning position. Motor type systems are inherently slow and noisy, however. On the contrary, in a true touch-timing system any of a number of channels or tuning positions may be instantly (and silently) selected by touching its associated position switch or button.

The system of the invention is an all-electronic touchtuning system which seeks the tuning position corresponding to the actuated position switch with a high speed counter-driven analog switch. The only skill required on the part of the viewer is that the actuated position switch maintain electrical contact for a time sufficient for the tuning system to find that position. In the preferred embodiment, the sequencing time is sufficiently short that no conscious effort is required to maintain the switch actuated and the system appears to operate instantaneously.

OBJECTS OF THE INVENTION

Accordingly, a primary object of this invention is to provide a novel television tuning system.

Another object of this invention is to provide an improved touch-tuning system for television receivers.

SUMMARY OF THE INVENTION

In accordance with the invention, an all-electronic touch-tuning system for a varactor tuner television receiver includes a plurality of position switches individually associated with a corresponding plurality of tuning positions which are accessible by pulse driven switching means. Position seeking means couple the switching means to a clock pulse source for transferring control of the varactor tuner to the tuning position associated with the actuated one of the position switches.

DESCRIPTION OF THE PREFERRED EMBODIMENT

Referring now to the drawing, there is disclosed a combination-block and schematic diagram of all-electronic touch-tuning system constructed in accordance with the invention. A cyclical counter 20 has four output leads connected to a binary to decimal (B/D) converter 21. Counter 20 may be any of a number of well-known arrangements having, for example, 16 discrete counts or states. The counter is cyclical in that after counting 16, it starts over from 1 and vice versa. It has a U (up) input and a D (down) input and is a positive edge trigger device, that is, it is activated to count one count when either input is changed from a low voltage state to a high voltage state.

The 16 states of counter 20 are encoded in conventional binary form and impressed on four output leads as a series of either high or low voltage levels. For example, the first increment or state representing tuning position 1 is obtained when a 0 level potential appears on each of the four leads 20A, 20B, 20C and 20D. The second state, corresponding to tuning position 2, is indicated by a 1 level potential on the lead 20A and a 0 level potential on the other leads 20B-20D. In similar fashion, each of the 16 counts and corresponding tuning positions is represented by a distinct binary encoding of 0 and 1 level potentials on the output leads.

Binary to decimal converter 21 includes 16 consecutively numbered output terminals arranged for convenience in groups of 4. The number adjacent each terminal corresponds to the number of the tuning position on the television receiver. While the converter circuitry is not shown in detail, one terminal of converter 21 is at a positive potential and represents the "activated" tuning position. All other terminals are at zero potential (ground). Thus, in the first tuning position, terminal 1 is at a positive potential and terminals 2–16 are at 0. An additional pulse to the U input of counter 21 advances its count by one and terminal 2 of converter 21 is placed at a positive potential and terminals 1 and 3–16 are at ground. A pulse on the D terminal would have resulted in terminal 16 being positive and terminals 1–15 being at 0. For each successive pulse on the U input, terminals 3–16 are sequentially "activated" by being placed at a positive potential.

It will be appreciated that it is not essential that each pulse supplied to the counter result in a change of one tuning position, it being equally feasible to utilize more than one pulse for advancement. While the specific frequency of the pulse source is not critical, in the preferred embodiment it is 10 kHz. For simplicity, only the apparatus associated with tuning positions 1–4 is schematically shown. The apparatus associated with the other groups of four tuning positions is illustrated in block form.

The first group of terminals (1–4) of converter 21 is connected, through an amplifier 22 comprising individual buffer amplifiers B1, B2, B3 and B4, to the respective, and correspondingly numbered, inputs of an analog switch 42. Analog switch 42 does two things when a tuning position is accessed (activated). Firstly, it connects an appropriate one of a group 52 of a tuning potentiometers to a varactor tuning diode 76 in a tuner 75 thus transferring control of the tuner to that tuning position. Secondly, it results in energizing the appropriate one of a group 62 of indicator means comprising resistors 64–67, diodes D1-D4, indicator lamps N1-N4, indicator taps I1–I4 which, in conjunction with the lamps indicate the number of the channel receivable at that position, and switches S1-S4 for UHF/VHF bandswitching of the tuner.

A bandswitch 80 includes a pair of transistors 81 and 85 for energizing appropriate circuitry in tuner 75 for VHF and UHF operation. This circuitry is symbolically indicated by a resistor labelled VHF and a resistor labelled UHF. Buffer amplifier 22 also supplies, through a group of position switches 32, a position seeking means 89 comprising a pair of switching transistors 91 and 95. A continuously running clock 90 is connectable to the input of an AND gate 103 by position seeking means 89 for driving the D input of counter 20.

Alternate operational modes are obtained by the provision of remote control apparatus 110 for driving counter 20 in either an up or down direction (one step or count at a time) and by switches labelled UP and DN for manually causing a change of one tuning position in either direction.

Analog switch 42 is diagramatically indicated as containing a plurality of single pole switches, two for each of the four tuning positions to which the switch has access. Switch 42 (and its corresponding switches 43–45) are all solid state and preferably fabricated in integrated circuit form. The numbers in parentheses adjacent the terminals of switch 42 represent the terminal numbers used on a standard integrated circuit chip to be discussed later. The outputs of buffer amplifiers B1-B4 are connected to the analog switch input terminals 1–4, respectively. Two output terminals, identified by the position number followed by an "*a*" or "*b*", are provided for each position. Hence the output terminals for position 1 are 1*a* and 1*b*, for position 2, 2*a* and 2*b*, etc. The "*a*" output terminals are connected to the movable taps of corresponding tuning potentiometers R1-R4 in group 52. The "*b*" output terminals are connected to the corresponding sections of indicating means group 62. Operation of the upper No.1 single pole switch interconnects varactor tuning diode 76 with the tap on R1, and operation of the lower No.1 switch connects one terminal of a neon lamp N1 to ground through resistor 64. The other "*a*" output terminals of analog switch 42 are connected to the movable taps of the corresponding ones of the other tuning potentiometers R2, R3 and R4.

Each of tuning potentiometers R1-R4 is connected between a source of positive potential +V1 and ground. The other "*b*" output terminals of switch 42 are connected to corresponding ones of resistors 65, 66 and 67. The other ends of resistors 64–67 are connected, respectively, to the cathodes of diodes D1-D4 and indicator lamps N1-N4. A source of voltage +V2 supplies the other terminals of lamps N1-N4 through a resistor 63. The anodes of diodes D1-D4 are connected through U/V switches 51–54 to terminal X of bandswitch 80.

PNP transistors 81 and 85 will be seen to operate in a toggle fashion, that is, when one transistor is conducting, the other is cut off and vice versa. Transistor 81 includes an emitter 82 coupled to a source of voltage +V3, a collector 83 coupled to the VHF resistor in tuner 75, and a base 84 connected to a resistor 77. PNP transistor 85 includes an emitter 86 coupled to +V3, a collector 87 coupled to the junction of resistor 77 and the UHF resistor in tuner 75, and a base 88 connected, through a resistor 79, to terminal X. A bias resistor 78 is connected between +V3 and terminal X to insure turn off of transistor 85.

Position seeking means 89 comprises a pair of NPN transistor switches 91 and 95 arranged to control the operation of counter 20, and hence the sequencing of the analog switch among the desired tuning positions. This is accomplished by allowing pulses from clock 90 to reach the counter whenever any of the position switches P1-P4 is actuated. Specifically, input terminal 1 of analog switch 42 is connected, via single pole momentary contact position switch P1, to a terminal W on position seeking means 89. (Similarly, position switches P2, P3 and P4 are connected, respectively, between input terminals 2, 3 and 4 of analog switch 42 and terminal W.) Closure of any of switches P1-P4 places terminal W at the potential of the corresponding input terminal of analog switch 42.

Transistor 91 has a grounded emitter 92, a collector 93 and a base 94. Clock 90 is coupled to base 94 through a resistor 101. A source of positive potential +V4 is connected, through a load resistor 100, to collector 93, which is also connected to one input of an AND gate 103. Resistor 101 also acts as a load resistance for transistor 95, which has a grounded emitter 96, a collector 97 and a base 98. Base 98 is connected to terminal W and is also supplied positive potential from +V4 through a resistor 102. The collector of transistor 95 is connected to the base of transistor 91.

Terminal W is normally positive (actually the emitterbase voltage of transistor 95) because of its connection to +V4 and drives transistor 95 into conduction since its base is positive with respect to its emitter. Conduction in transistor 95 holds the potential of its collector near ground and maintains transistor 91 cut off. With transistor 91 cut off, pulses from clock 90 are not translated through transistor 91 and gate 103 and counter 20 is not advanced.

Counter 20 is advanced one count whenever the potential on either of its inputs changes from low to high. If the D input goes high, the counter counts down one step or count. Similarly, if the U input is driven high, the counter counts up one count. Normally, both the U and D inputs are low and the counter is at rest. The output of AND gate 103, which supplies the D input through an inverter 120, is low except when both of its inputs are high. One input of AND gate 203 is high because of its connection to +V5 through a resistor 105 and the other gate input is high because of its connection to the collector of normally off transistor 91.

Assume that the tuning system is at tuning position 4 and position switch P1 is actuated by the viewer. (It will be recalled that in tuning position 4 converter terminal 4 is at a positive potential and all its other terminals are at ground.) Terminal W of position seeking means 89 is thus placed at ground by switch P1. With base 98 at ground potential, transistor 95 turns off, its collector goes positive and enables transistor 91 to turn on in response to a clock pulse, that is, when the clock output is high. Each clock pulse turns on transistor 91, driving collector 93 low and the output of AND gate 103 low. Inverter 120 thus drives the D input of counter 20 high, causing it to register a count of one in the down direction. Additional pulses from clock 90 are similarly translated by transistor 91 and each successive clock pulse switches the potential on the D input of counter 20 from low to high causing it to count and drive B/D converter 21.

For each count change of one, corresponding to a pulse, B/D converter 21 places a positive potential on a successive one of its terminals. Thus, after one pulse, terminal 3 is positive, after 2 pulses, terminal 2 is positive. Since ground potential remains on terminal 1, however, transistor 95 remains cut off, and transistor 91 is switched on and off by clock 90, keeping the counter supplied with pulses. When terminal 1 is placed at a positive potential by B/D converter "addressing" it (after the third pulse), terminal W goes positive, drives transistor 95 into saturation, and cuts off transistor 91. Both inputs of AND 103 are again high, making its output high and the D input of counter 20 low, thus stopping the counter. Hence the tuning system has responded to actuation of position switch P1 by activating terminal 1 of analog switch 42, the channel tuning position corresponding thereto. Note that the position switch remains closed during this search. While it is possible to break the contact made by the position switch before the analog switch "accesses" the correct tuning position, it would represent a rare situation indeed. In the unlikely event this occurs, switch 111 would access some intermediate tuning position.

When terminal 1 of analog switch 42 is energized, its No.1 electronic switches are closed. One switch connects the variable tap on tuning potentiometer R1 to varactor diode 76. Adjustment of the potentiometer varies the DC voltage supplied to varactor diode 76 and, in a well-known manner, changes its capacitance for tuning the appropriate circuits in tuner 75 to receive the desired television channel. The other switch grounds one end of resistor 64, energizing lamp N1 and illuminating indicator tab 11. In the illustration, the indicator lamps are neon bulbs, but it will be apparent from the following that incandescent type bulbs may also be used with appropriate circuit modifications. Closure of the latter switch also provides a voltage for operation of bandswitch 80 between its UHF and VHF positions. Each tuning position has an associated U/V switch which is set in accordance with whether a UHF or a VHF channel is receivable at that tuning position. The switches may be operated manually by the viewer or serviceman when setting up the receiver or may be operated automatically by the insertion of a special channel indicator tab as disclosed and claimed in U.S. Pat. No. 3,835,395 issued Sept. 10, 1974, entitled TELEVISION CHANNEL INDICATING TAB WITH AUTOMATIC VHF/UHF SWITCHING, in the name of Dennis D. Smith and assigned to the assignee of the present invention.

When a UHF channel is to be received, the appropriate switch is closed as indicated, for example, by switches S2 and S3. When either of these tuning positions is accessed by the analog switch, the appropriate one of resistors 65 and 66 is grounded, thus lowering the potential at terminal X. The emitter-base junction of transistor 85 is forward biased and transistor 85 conducts and develops potential across the (symbolic) UHF resistor in the tuner. Its collector potential rises and biases transistor 81 into non-conduction. When the tuning system is set to receive a VHF channel, the appropriate U/V switch is open and termainl X is at +V3. Accordingly, transistor 85 is cut off and its collector is at ground potential causing transistor 81 to be driven into conduction and developing a potential across the (symbolic) VHF resistor in tuner 75.

Remote circuit unit 110, which includes a microphone 113, is schematically represented by a pair of single pole switches 111 and 112 grounded at one terminal and connectable to a pair of junctions 108 and 109, respectively, at their other terminals. A source of voltage +V5 is connected to junction 108 through a resistor 104 and to junction 109 through a resistor 105. Junction 108 is also connected through an inverter 121 to the U input of counter 20 and junction 109 is connected to an input of AND GATE 103.

It will be understood that switches 111 and 112 in remote control unit 110 are selectively actuated by reception of appropriate control signals transmitted from a point removed from microphone 113. When actuated, switch 111 places ground potential on inverter 121 and, therefore, a positive potential on the U input of counter 20 and switch 112, through AND gate 103 and inverter 120 places a positive potential on the D input of counter 20, respectively.

Voltage source +V5 maintains the U input of counter 20 low, by virtue of inverter 121, and the second input of AND gate 103 positive (high level). As the other input of AND gate 103 is also positiive, its output is positive and, by virtue of inverter 120, the D input is low and the counter is at rest. Momentary actuation of switch 111, in response to an appropriate "up" control signal raises the potential on the U input of counter 20 causing it to advance one count. Similarly, closure of switch 112 responsive to a "down" control signal grounds an input of AND gate 103 causing the potential on the D terminal of counter 20 to be raised and step the counter in the down direction. Another pair of switches labelled, UP and DOWN, are connected in parallel with switches 111 and 112 and may be operated at the receiver for sequencing the counter one count or step at a time in either direction. Repeated actuation of either switch enables a viewer to sequence through all tuning positions without depressing different touch switches.

The above description concerned tuning positions 1–4. For tuning positions 5–8, 9–12 and 13–16, corresponding apparatus is provided. Since it operates identically, such apparatus is indicated in block form only. A plurality of amplifiers 23, 24 and 25 are shown connected to analog switches 43, 44 and 45 which, in turn, feed groups 53, 54 and 55 of tuning potentiometers and groups 63, 64 and 65 of indicating means 62. The respective buffer amplifiers also supply groups 33, 34 and 35 of position switches. As indicated by the arrows and letters, the position switches are connected to terminal W on position seeking means 89, the analog switches are connected to the varactor diode 76 (terminal Z) and the indicator means are connected to terminal X 0n bandswitch 80. In the same manner as that described, the successive groups of four terminals on B/D converter 21 supply the apparatus indicated in block form for driving the commonly shared bandswitch, position seeking means and counter.

In practice, cyclical counter 20 may be obtained under the designation N74193/7400TTL, B/D converter 21 under the designation N74154/7400TTl and amplifiers 22, 23, 24 and 25 under the designation N7407/TTL7400, all from Signetics Corporation of Sunnyvale, California. Analog switches 42, 43, 44 and 45 may be obtained under the designation SN16848 from Texas Instruments, Inc. of Dallas, Texas.

Connection of the B/D converter is straightforward. The analog switches bear numbered designations in parentheses which correspond to the designations on the device as manufactured. Terminals (7) and (8) are connected together and feed the varactor diodes. Terminal (9) is connected to a source of DC +V6 and terminal (10) is grounded.

What has been described is a novel all-electronic touchtuning system for a television receiver utilizing a counter driven B/D converter and an analog switch. While particular embodiments of the invention have been shown and described, it will be obvious to those skilled in the art that changes and modifications may be made without departing from the invention in its broader aspects, and, therefore, the aim in the appended claims is to cover all such changes and modifications as fall within the true spirit and scope of the invention.

What is claimed is:

1. An electronic touch-tuning system for a television receiver having a varactor tuner and a plurality of position switches individually associated with a corresponding plurality of tuning positions, comprising:

pulse driven switching means including a cyclical counter for sequentially transferring control of said varactor tuner among said tuning positions;

a pulse source; and position seeking means coupling said switching means to said pulse source for transferring control of said tuner to the tuning position associated with the actuated one of said position switches.

2. An electronic touch-tuning system as set forth in claim 1 wherein said pulse driven switching means further includes a binary to decimal converter; said cyclical counter producing a binary coded output for driving said converter.

3. An electronic touch-tuning system as set forth in claim 2 further including a plurality of tuning potentiometers corresponding to said tuning positions, each said potentiometer having a movable tap for adjusting the tuning voltage for said varactor tuner; said pulse driven switching means further including an analog switch coupled between said converter and said potentiometers for selectively connecting the movable taps of said potentiometers to said varactor tuner.

4. An electronic touch-tuning system as set forth in claim 3 wherein said position seeking means comprises transistor switch means coupled between said pulse source and said cyclical counter for energizing said counter from said pulse source responsive to actuation of any of said plurality of position switches.

5. An electronic touch-tuning system as set forth in claim 4 wherein said switching means comprises a normally on transistor connected across the input of a normally off transistor, said pulse source being coupled to said input of said normally off transistor, said position switches, upon actuation, driving said normally on transistor to its off state and switching said normally off transistor to its on state.

6. An electronic touch-tuning system as set forth in claim 5 further including up-down control switches coupled to said counter for sequencing said switching means to advance to an immediately adjacent tuning position.

7. an electronic touch-tuning system as set forth in claim 6 including an AND gate coupled between the output of said normally off transistor and one of said up-down control switches.

* * * * *